United States Patent
Bristol et al.

(10) Patent No.: US 10,490,416 B2
(45) Date of Patent: Nov. 26, 2019

(54) STRUCTURES AND METHODS FOR IMPROVED LITHOGRAPHIC PROCESSING

(71) Applicant: Intel Corporation, Santa Clara, CA (US)

(72) Inventors: Robert L. Bristol, Portland, OR (US); James M. Blackwell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/769,017

(22) PCT Filed: Nov. 16, 2015

(86) PCT No.: PCT/US2015/060811
§ 371 (c)(1),
(2) Date: Apr. 17, 2018

(87) PCT Pub. No.: WO2017/086907
PCT Pub. Date: May 26, 2017

(65) Prior Publication Data
US 2018/0294167 A1  Oct. 11, 2018

(51) Int. Cl.
*H01L 21/311* (2006.01)
*H01L 21/033* (2006.01)
(Continued)

(52) U.S. Cl.
CPC .. *H01L 21/31144* (2013.01); *H01L 21/02041* (2013.01); *H01L 21/02164* (2013.01);
(Continued)

(58) Field of Classification Search
None
See application file for complete search history.

(56) References Cited

U.S. PATENT DOCUMENTS

| 9,041,217 B1 | 5/2015 | Bristol et al. |
| 2004/0185674 A1 * | 9/2004 | M'Saad ............... C23C 16/401 438/761 |

(Continued)

FOREIGN PATENT DOCUMENTS

| KR | 20100138907 A | 12/2010 |
| WO | 2015047318 A1 | 4/2015 |

OTHER PUBLICATIONS

T. Kropewicki et al., J. Vac. Sci. Technol. A, vol. 19, pp. 1384-1387. (Year: 2001).*

(Continued)

*Primary Examiner* — Jiong-Ping Lu
(74) *Attorney, Agent, or Firm* — Patent Capital Group

(57) ABSTRACT

Described herein are structures and methods for preparing photobuckets for lithography, e.g. photolithography or electron-beam lithography. One method includes arranging photobuckets on a material to be etched using lithography and providing a layer of a first material at least on inner side walls of the photobuckets, followed by filling the photobuckets with a second material. The second material is more lithosensitive than the first material and the first material could be not lithosensitive at all. Layering each photobucket from the inner side wall(s) of the photobucket towards the center of the photobucket with materials that are increasingly more lithosensitive results in an improved control of lithographic patterning by reducing or eliminating edge placement errors of accidentally exposing photobuckets that should not have been exposed.

25 Claims, 9 Drawing Sheets

(51) Int. Cl.
*H01L 21/02* (2006.01)
*H01L 21/3105* (2006.01)
*H01L 21/768* (2006.01)
*H01L 23/522* (2006.01)

(52) U.S. Cl.
CPC .... *H01L 21/02378* (2013.01); *H01L 21/0338* (2013.01); *H01L 21/31053* (2013.01); *H01L 21/76816* (2013.01); *H01L 21/76879* (2013.01); *H01L 21/76897* (2013.01); *H01L 23/5226* (2013.01)

(56) References Cited

U.S. PATENT DOCUMENTS

| | | |
|---|---|---|
| 2010/0264538 A1 | 10/2010 | Swinnen et al. |
| 2011/0053087 A1 | 3/2011 | Nielsen et al. |
| 2015/0093702 A1 | 4/2015 | Nyhus et al. |
| 2015/0171010 A1 | 6/2015 | Bristol et al. |
| 2015/0179513 A1 | 6/2015 | Myers et al. |
| 2015/0255284 A1 | 9/2015 | Bristol et al. |

OTHER PUBLICATIONS

International Search Report and Written Opinion issued in PCT Application No. PCT/US2015/060811 dated Jul. 21, 2016; 8 pages.

* cited by examiner

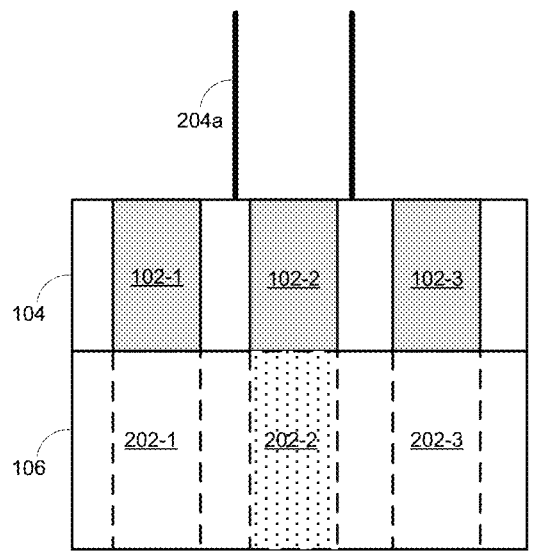
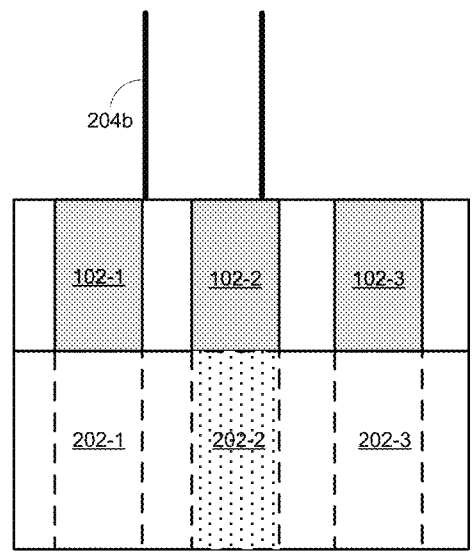
FIG. 2a    FIG. 2b
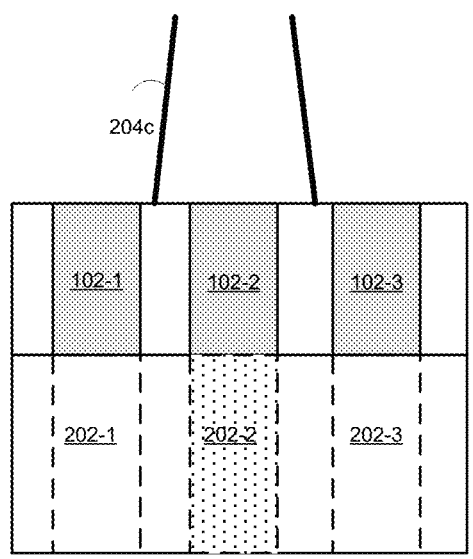
FIG. 2c

STRUCTURES AND METHODS FOR IMPROVED LITHOGRAPHIC PROCESSING

CROSS-REFERENCE TO RELATED APPLICATIONS

This Application is a national stage application under 35 U.S.C. § 371 of PCT Application PCT/US2015/060811, filed Nov. 16, 2015, and entitled "STRUCTURES AND METHODS FOR IMPROVED LITHOGRAPHIC PROCESSING," which is hereby incorporated by reference in its entirety.

TECHNICAL FIELD

This disclosure relates generally to the field of integrated circuits and semiconductor manufacturing, and more specifically, to structures and methods for improved lithographic processes.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer, which may be referred to as a via location opening. Next, an opening for the via may be etched in the dielectric layer by using the location opening in the photoresist layer as an etch mask. This opening in the dielectric layer is referred to as a via opening. Finally, the via opening may be filled with one or more metals or other conductive materials to form the via.

In the past, the sizes and the spacing of vias have progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of lithographic manufacturing technologies.

BRIEF DESCRIPTION OF THE DRAWINGS

FIGS. 2a-2f provide schematic illustrations of a cross-section of the three-dimensional view of FIG. 1.

DETAILED DESCRIPTION

Figure 1:
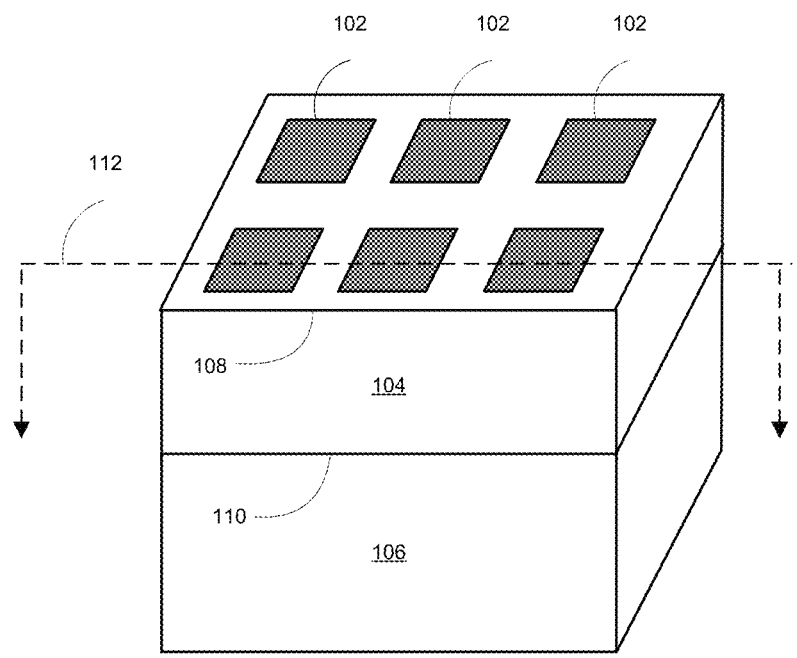
FIG. 1 provides a three-dimensional perspective view of conventional photobuckets.

Described herein are structures and methods for preparing photobuckets for lithography, e.g. photolithography or electron-beam lithography. Some of the disclosed methods include arranging the photobuckets on a material to be etched using lithography and providing a layer of a first material at least on inner side walls of the photobuckets, followed by filling the photobuckets with a second material. The second material is more lithosensitive than the first material and the first material could be not lithosensitive at all. Layering each photobucket from the inner side wall(s) of the photobucket towards the center of the photobucket with materials that are increasingly more lithosensitive results in an improved control of lithographic patterning by reducing or eliminating edge placement errors of accidentally exposing photobuckets that should not have been exposed.

As used herein, the term "lithosensitive" is used to describe materials that, upon their exposure to a lithographic beam, such as e.g. optical irradiation during photolithography or e.g. an electron beam during electron-beam lithography, followed by chemical processing, may be removed, thereby allowing patterning. In context of photolithography, lithosensitive materials are typically referred to as "photosensitive" or "photolyzable" materials, with photoresist being one well-known example.

As used herein, the term "non-lithosensitive" is used to describe materials that are not lithosensitive. Such materials may also be referred to as "lithoinert" materials.

In the following, various exemplary embodiments are described with reference to lithographic processing being photolithography, in particular EUV lithography, used for forming vias. However, teachings provided herein are equally applicable, possibly with modifications that would be apparent to a person of ordinary skill in the art, to photolithographic processes using wavelengths other than EUV, as well as to charged-particle lithographic processes, such as e.g. electron-beam lithography, all of which are within the scope of the present disclosure. In addition, even when described with reference to forming vias, teachings provided herein may be used for forming any type of interconnect structures, such as e.g. lines or trenches, typically within a dielectric layer such as an interlayer dielectric (ILD). Still further, teachings provided herein are not limited to forming interconnects in dielectric structures. In fact, teachings provided herein are applicable to nanopatterning of any structures for any purposes using lithographic processes. For example, in some embodiments, lithographic processing described herein may be used to form nanostructured material comprising relatively high aspect-ratio openings that are later filled with a precursor material for forming a low-k dielectric within the openings.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

In various embodiments, the interconnects as described herein may be used to connect various components associated with an integrated circuit. Components include, for example, transistors, diodes, power sources, resistors, capacitors, inductors, sensors, transceivers, receivers, antennas, etc. Components associated with an integrated circuit may include those that are mounted on an integrated circuit or those connected to an integrated circuit. The integrated circuit may be either analog or digital and may be used in a number of applications, such as microprocessors, optoelectronics, logic blocks, audio amplifiers, etc., depending on the components associated with the integrated circuit. The integrated circuit may be employed as part of a chipset for executing one or more related functions in a computer.

In the embodiments where at least some of the components associated with an integrated circuit are transistors, a plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate interconnect support layer and a gate electrode layer. The gate interconnect support layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate interconnect support layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanate, barium titanium oxide, strontium titanium oxide, yttrium oxide, aluminum oxide, lead scandium tantalum oxide, and lead zinc niobate. In some embodiments, an annealing process may be carried out on the gate interconnect support layer to improve its quality when a high-k material is used.

The gate electrode layer is formed on the gate interconnect support layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics may be deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

To provide context, conventionally, fabrication techniques for vias involved a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are extremely expensive for a semiconductor manufacturing process.

In order to improve on such conventional fabrication techniques, a use of so-called "photobuckets" has been proposed. FIG. 1 provides a three-dimensional perspective view of photobuckets 102 provided within a mask layer 104 provided over a material layer 106 to be etched, e.g. an ILD 106. The mask layer 104 is made of non-lithosensitive materials that, if exposed to a photo beam during photolithography or if exposed to a charged-particle beam during e.g electron-beam lithography, would not react with the beam as to be removed as a result of their exposure. In context of photolithography, such materials are typically referred to as "non-photolyzable materials."

The photobuckets 102 are openings extending from the top to the bottom surface 110 of the mask layer 104, the top surface indicated in FIG. 1 as a surface 108 and the bottom surface indicated as a surface 110. Current use of photobuckets involves uniformly filling the photobuckets with photoresist and then carrying out traditional photolithography process as known in the art by selectively exposing only those photobuckets corresponding to locations where vias are to be formed.

Using photobuckets allows achieving greater control over the locations where vias are formed, compared to the blind process described above. As a result, edge placement error (EPE), which is a measure of the difference between where the edge of a pattern ends up and where the edge of that pattern was supposed to be, may be somewhat reduced. EPE is closely related to overlay error, which refers to where the average litho-defined pattern is located. EPE covers pattern edge movement due to other factors, such as e.g. fluctuations in resist (line-edge roughness, etc) and fluctuations due to etch.

Figure 2D:
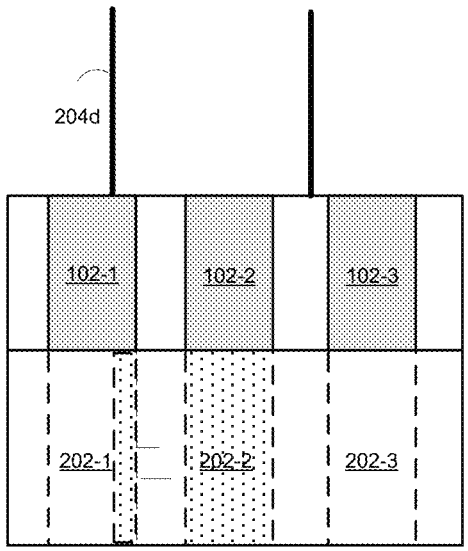

While using photobuckets allows achieving greater control over the locations where vias are formed, even with such an improved process, accidental exposure of photobuckets that should not be exposed may occur, which may result in creating vias in locations where vias should not be. For example, consider various exemplary scenarios shown in FIGS. 2a-2f, each providing a schematic illustration of the same cross-section 200 in a plane 112 as indicated in FIG. 1. In the cross-section 200, three adjacent photobuckets 102 are identified as photobuckets 102-1, 102-2, and 102-3. Consider that a via is to be formed in the location corresponding to the photobucket 102-2, but not in locations corresponding to photobuckets 102-1 and 102-3. In other words, the ILD 106 should be etched to form a via in an area 202-2, but it should not be etched in areas 202-1 and 202-3. Consider, first, that during photolithography, a photo beam is aligned perfectly with the photobucket 102-2, as shown in FIG. 2a with a beam 204a. In such a case it is possible to only form a via opening in the area 202-2 but not in areas 202-1 and 202-3, as indicated in FIG. 2a with only the area 202-2 shown as a dotted area.

Even if a photo beam was slightly misaligned as shown in FIG. 2b with a beam 204b or diverging as shown in FIG. 2c with a beam 204c, because the mask layer 104 is made of a non-photolyzable material, accidental exposure of that layer to a photo beam during photolithography does not result in creating an opening for the etch of the material layer 106 where it should not be. Consequently, because the photobuckets 102 are surrounded by a non-photolyzable material, the lithographic constraints may be relaxed and misalignment tolerance may be relatively high. Further, instead of exposing at, e.g. 30 mJ/cm2, such photobuckets might be exposed at, e.g., 3 mJ/cm2. Normally this would result in very poor critical dimension (CD) control and roughness. But in this case, the CD and roughness control will be defined by the photobuckets, which can be very well controlled and defined. Thus, the photobucket approach may be used to circumvent imaging/dose tradeoff which limits the throughput of next generation lithographic processes.

However, as sizes of the vias and the pitches between the vias continue decrease, sizes and pitches of the photobuckets needs to decrease. As a result, undesirable situations as shown in any of the FIGS. 2d-2f may occur.

FIG. 2d illustrates a beam 204d that happens to be so wide that it exposes a part of a neighbouring photobucket, shown in FIG. 2d as exposing the photobucket 1024. As a result of this accidental exposure, area 206 within the area 202-1 will be etched and subsequently filled with via material, creating a via where a via should not be.

Figure 2E:
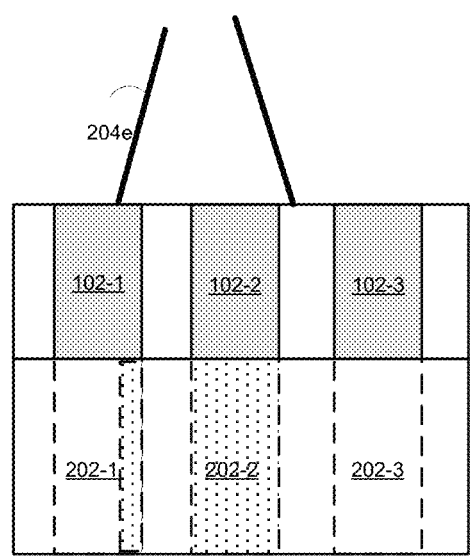

FIG. 2e illustrates a beam 204e that happens to diverge so that, similar to the scenario of FIG. 2d, it also exposes a part of the photobucket 102-1. As a result, again, the area 206 will be etched and subsequently filled with via material, creating a via where a via should not be.

Figure 2F:
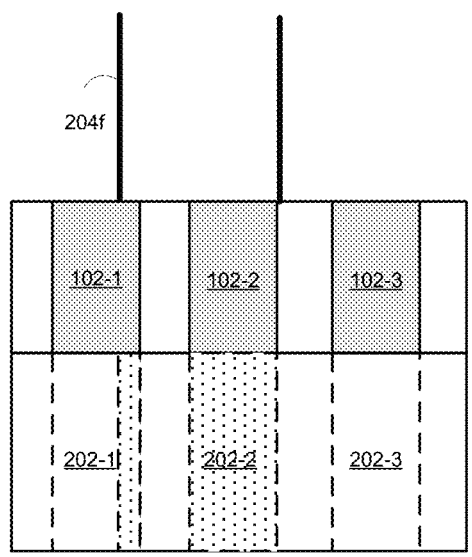

FIG. 2f illustrates yet another example showing a beam 204f that happens to be misaligned so that it exposes a part of the photobucket 102-1, leading to the same result as in FIGS. 2d and 2e.

As via sizes and pitches scale ever smaller over time, situations such as illustrated in FIGS. 2d-2f or combinations thereof are likely to occur because lithographic equipment is not able to keep up. Embodiments of the present disclosure provide a solution that may eliminate or at least reduce this problem, thus providing further improvements with respect to EPE and control of lithographic processing of nanofeatures.

Figure 3:
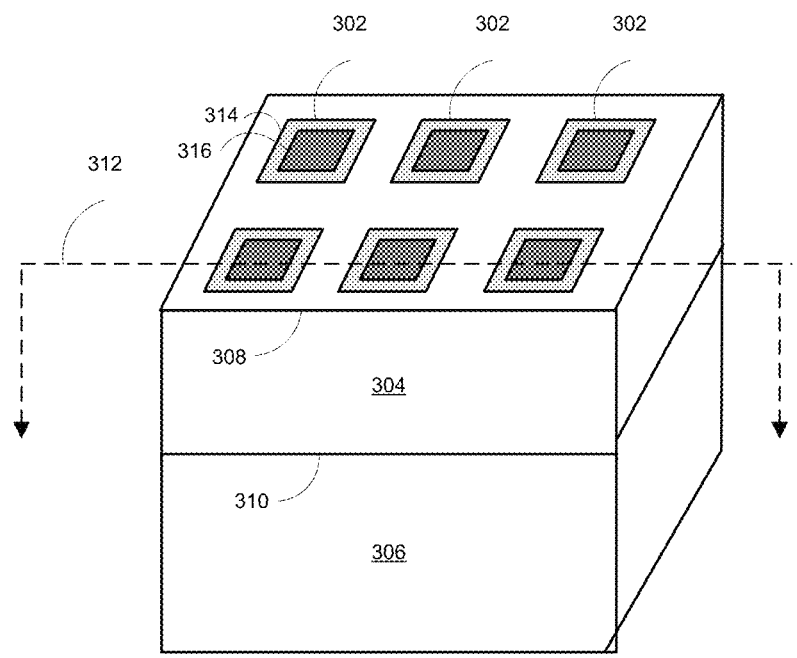
FIG. 3 provides a three-dimensional perspective view of lined photobuckets, according to some embodiments of the present disclosure.

FIG. 3 provides a three-dimensional perspective view 300 of lined photobuckets 302, according to some embodiments of the present disclosure. Similar to the photobuckets 102 shown in FIG. 1, the photobuckets 302 are provided within a mask layer 304 disposed over a material layer 306 to be etched.

In various embodiments, the material layer 306 to be etched may be an ILD. Two or more layers of the interlayer dielectric may be stacked to form an integrated circuit. In some embodiments, the ILD may include one or more sacrificial layers deposited over a dielectric substrate. The ILD may include one or more dielectric materials, which are understood to be materials that are insulators but are polarized upon application of an electric field. In some embodiments, the material layer 306 may include a low-k dielectric material, that is, a material with a dielectric constant that is lower than 3.9, i.e., the dielectric constant of silicon dioxide, including all values and ranges from 1.5 to 3.8, such as 1.7, 1.9, 2.1, 2.8, 2.7, etc. Non-limiting examples from which the dielectric materials may be selected include fluorine-doped silicon dioxide, carbon doped oxide (i.e., carbon-doped silicon dioxide), organo silicate glass, silicon oxycarbide, hydrogenated silicon oxycarbide, porous silicon dioxide, and organic polymer dielectrics such as polyimide, polytetrafluoroethylene, polynorbornenes, benzocyclobutene, hydrogen silsequioxane and methylsilsesquioxane. The material layer may have a thickness in the range of 50 nm to 300 nm, including all values and ranges therein, such as 100 nm to 300 nm, 100 nm to 200 nm, etc.

The photobuckets 302 are openings extending from the top to the bottom surface of the mask layer 304, the top surface indicated in FIG. 3 as a surface 308 and the bottom surface indicated as a surface 310.

As illustrated in the figures provided herein, for simplicity, various parts of the photobuckets 302 are square in their top-view and rectangular in their cross-section. However, in various embodiments, other geometries may be assumed for the cross-section as well as for a top-view of different parts of the photobuckets such as square, oblong, elliptical or any variations thereof. In fact, in practice, fabricated photobuckets rarely have perfectly square top views and perfectly rectangular cross-sections.

Similar to the mask layer 104 shown in FIG. 1, the mask layer 304 is made of non-lithosensitive materials, e.g. non-photolyzable materials if the mask layer 304 is used in a photolithographic process.

In contrast to photobuckets 102 shown in FIG. 1 which were all filled uniformly with photoresist, photobuckets 302 are layered. In particular, at least the inner walls of the photobuckets 302, possibly also the floors of the photobuckets, are provided with a layer of a first material 314. Then a second material 316 fills the rest of the photobuckets.

Figure 4:
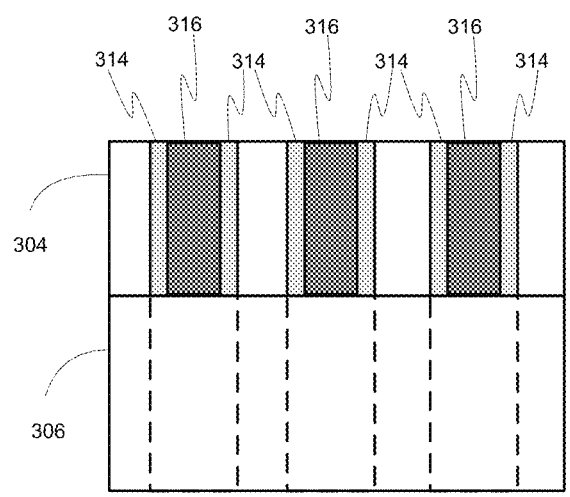
FIG. 4 provides a schematic illustration of a cross-section of the three-dimensional view of FIG. 3, according to some embodiments of the present disclosure.

FIG. 4 provides a schematic illustration of a cross-section of the three-dimensional view of FIG. 3, taken in a plane 312 as indicated in FIG. 3, according to some embodiments of the present disclosure. FIG. 4 illustrates photobuckets extending from the top to the bottom surface of the mask structure 304 disposed over the ILD 306 to be etched. FIG. 4 illustrates how the lining of the sidewalls of the photobuckets with a layer of material 314 extends from the top to the bottom surface and the rest of the photobuckets is filled with the second material 316.

In other embodiments (not shown in FIGS.), there could also be a layer of material 3:14 at the floors of the photobuckets, i.e. at the inner surfaces of the photobuckets closest to the bottom of the mask structure or being the bottom of the mask structure 304. Furthermore, in some embodiments (also not shown in FIGS.), additional layers of different materials may be provided on the walls of the photobuckets.

Different materials provided within the photobuckets are selected so that the material at the center of the photobucket is the most photosensitive, or, in general—the most lithosensitive, and materials provided in layers further away from the center are selected so that each layer further away from the center has photosensitivity that is equal to or smaller than photosensitivity of an adjacent material that is closer to the center. At a certain point, materials that are not in the center of the photobuckets may comprise materials that are not photosensitive at all, or only marginally photosensitive. For the example of two materials as shown in FIG. 4, this means that material 316 would be more photosensitive than material 314, where material 314 could be a material that is not photosensitive at all.

Using specially designed surface treatments, a layer of the first material 314 may be provided e.g. as a layer of quencher molecules, such as e.g. amines or pyridines. Quencher molecules can be attached to at least side walls and optionally also floor of standard photobucket features in place of the conventional Hexamethyldisilazane (HDMS) treatment for increasing adhesion of photoresist which leaves inert surface.

Molecules such as pyridylethyltriethoxysilane (PETES) and aminopropyltriethoxysilane (APTES) are just two examples which can be grafted to Si—OH rich surfaces either via vapor-phase or solution deposition. Grafting density, thickness, basicity and other factors can be varied depending on the specific molecules used and the processing conditions used to apply the molecules. With thin layer of quencher coating surface of photobucket as the first material 314, conventional photoresist may then be applied as the second material 316, e.g. by spin coating, leading to case where quencher concentration at the sidewalls is greater than in center of buckets.

In buckets that receive unwanted partial dose of photons due to edge placement error, as e.g. was shown for the photobuckets 2024 illustrated in FIGS. 2d-2f, small amounts of acid will be generated from the photo-acid generator (PAG) selectively at edges. Due to high relative concentration of quencher in this area, the catalytic effect of the acid is nullified preventing partial deprotection of the photoresist polymer and ultimately preventing partial dissolution during development step. Thus, if situations as illustrated in FIGS. 2d-2f would occur with the photobuckets 302, a via opening would not be etched within the areas 202-1 because the sidewall layer 314 of less photosensitive material that would be provided on the sidewalls of the photobucket 102-1 shown in FIGS. 2d-2f would prevent partial or complete dissolution of the material on the accidentally exposed side of the photobucket 102-1. As a result, the photobucket 102-1 would retain enough material within it to prevent etching of any parts of the area 102-1.

The addition of quencher layer 314 to the inner surfaces of the photobuckets 302 allows using lower quencher loadings in the photoresist, or more PAG, used as the filling material 316 in the center. Optimization of loadings of PAG, free quencher and grafted quencher may be required to ensure efficient removal of photoresist in exposed photobuckets while preventing partial opening of others.

In some embodiments, in fully exposed photobuckets, de-protected photoresist may adhere strongly to quencher layer and may not be removed during tetramethylammonium hydroxide (TMAH) development step. In such embodiments, a second development step using dilute acid, such as e.g. hydrofluoric (HF) acid, may be used to detach the polymer or the surface grafted layer itself while not affecting the hydrophobic unexposed photoresist remaining in unexposed areas.

An extra benefit of grafting quencher to the inner surface of the photobuckets as the layer 314 is an improvement in resist stochastics from bucket to bucket. Typically, with low relative amounts of quencher used in photoresists, there is a large variation in the absolute number of free quenchers present in over 1 billion photobuckets expected to be present on a 300-millimeter (mm) wafer. In contrast, embodiments of the present disclosure ensure greater uniformity of quencher from bucket to bucket by virtue of delivering the quencher, either partially or fully, through the grafting process of providing the layer 314, due to surface-limited nature of grafting process. In some embodiments, the uniformity of grafting can be controlled through control of Si—OH content at the inner surfaces of the photobuckets 302.

In some embodiments, photodecomposable bases (PDBs) may be used as the quencher in photoresists. These types of quenchers are typically based on triarylsulfonium salts with weak conjugate acid anions such as benzoates. In various embodiments, these types of molecules can also be grafted directly to the inner surface of the photobuckets as the layer 314, where grafting groups such as e.g. —Si(OEt)3 are attached to one or more of the sulfonium aryl groups. Since a proportion of these molecules must be decomposed, i.e. basic benzoate converted to weak benzoic acid, during EUV exposure, they will contribute to overall photon stochastics. The more PDB that needs to be decomposed, the less pronounces is the photon variation from bucket to bucket. In turn, higher doses of EUV exposure may be needed. However, by grafting significant proportion, or all, of the PBD to the inner surfaces of the photobuckets, higher quantum yields are expected.

Dense SiO2-type surfaces have higher EUV absorbance cross-sections than typical photoresists. More secondary electrons will be generated at SiO2 in proximity of the PDBs leading to greater quantum yield for this activation. Thus, at a fixed dose of EUV irradiation, more base may be destroyed in each photobucket 302 for surface-grafted case than standard case where PDB is introduced in the resist itself.

Embodiments of the present disclosure are not limited to SiO2 surfaces. In fact, higher absorbing metal, metal oxide, metal nitride and other films may have an even greater impact on photon stochastics. These higher absorbing surfaces can result from initial patterning into other materials or through coating by atomic layer deposition (ALD) or other methods for providing ultra-thin films containing high absorbing elements such as Sn, Ge, Ni, Co, Hf, Sb, Bi etc. Grafting of PDBs via silyl functionality may then occur as described above or through other common functionality like phosphonic acids, amines, thiols, N-heterocyclic carbenes, etc.

Similar benefits for photon and resist stochastics are expected through grafting PAG to surface, which could be done in some embodiments of the present disclosure. In cases of sulfonium-based PDB and sulfonium-based PAG, the anions, e.g. benzoate vs sulfonate, will exchange between surface-grafted and free positions leading to both PDB and PAG being grafted to the inner surfaces of the photobuckets 302 and both PDB and PAG being present in the resist as well.

Figure 5:
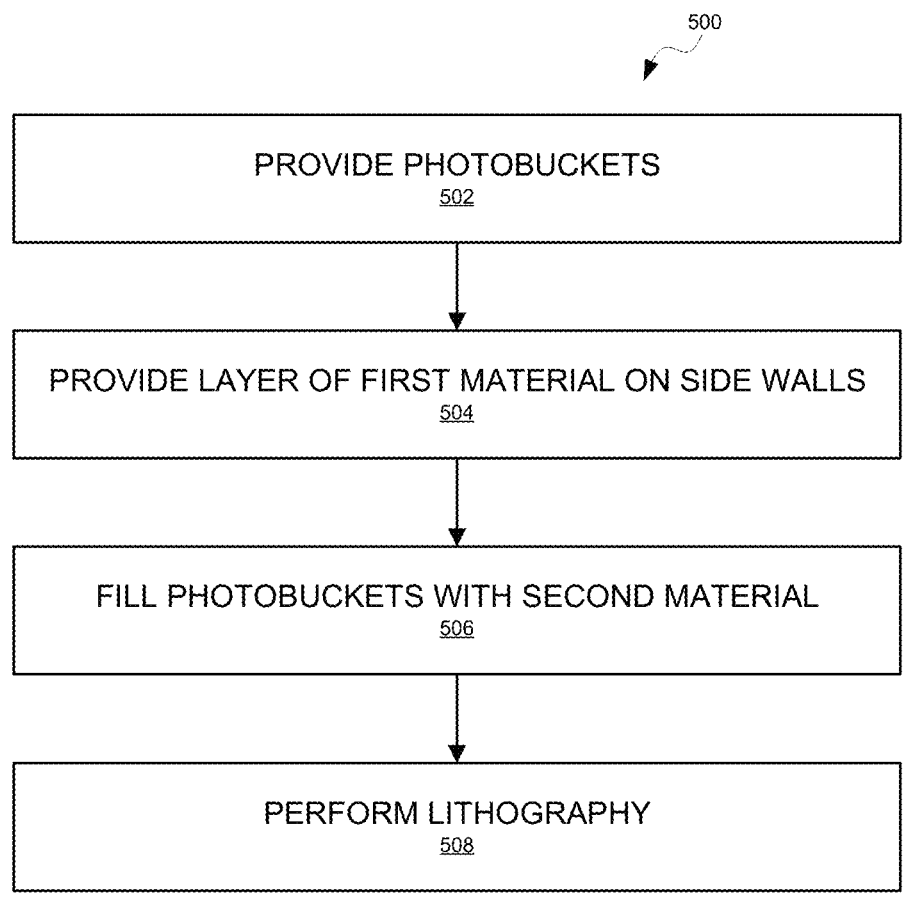
FIG. 5 provides a flow chart of a method for preparing photobuckets for lithography, according to some embodiments of the present disclosure.

FIG. 5 provides a flow chart of a method 500 for preparing photobuckets for lithography, according to some embodiments of the present disclosure.

The method 500 may begin with box 502, where photobuckets are provided. Various manners for providing photobuckets over a material to be etched are known in the art, such as e.g. forming self-aligned photobuckets, forming photobuckets by an etch-back process, and/or forming photobuckets by a lithographic/shrink/etch process, all of which are within the scope of the present disclosure.

Next, a layer of the first material 314 is provided on at least the side walls, but possibly also on the floors of the photobuckets (box 504 in FIG. 5), which may be done in any of the manners described above.

Once the layer of the first material 314 has been provided, the photobuckets may be filled with the second material 316 (box 506 in FIG. 5). In some embodiments, the second material 316 may comprise an ultrafast photoresist or electron-beam resist or other lithosensitive material as formed in the openings of the photobuckets 302 lined with the first material 314. In one such embodiment, a thermal reflow of a polymer into the photobucket openings may be used following a spin coat application of the second material 316. In one embodiment, the fast photoresist may be fabricated by removing a quencher from an existing photoresist material.

It is to be understood that the photobuckets 302 need not be filled with actual photoresist, so long as the material 316, and possibly also the material 314, acts as a photosensitive switch.

Then, lithography may be used to expose the photobuckets that are selected for removal, i.e. photobuckets are selectively exposed (box 508 in FIG. 5). In various embodiments, any of the known lithographic processes may be used, all of which are within the scope of the present disclosure.

Figure 6:
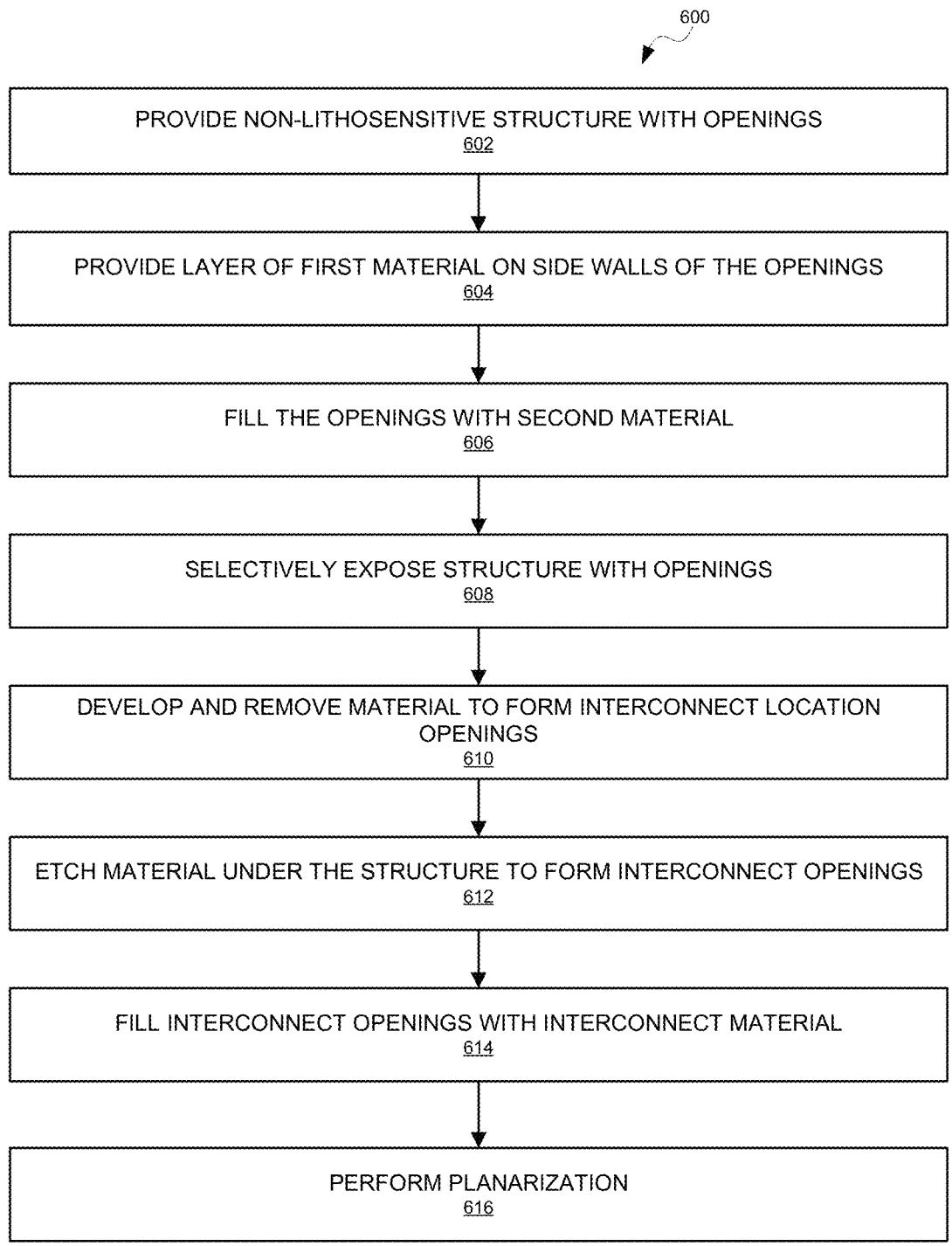
FIG. 6 provides a flow chart of a method for forming interconnects, according to some embodiments of the present disclosure.

FIG. 6 provides a flow chart of an exemplary method 600 for forming interconnects, according to some embodiments of the present disclosure.

The method 600 may begin with box 602, where a non-lithosensitive structure is provided over a material to be etched (e.g. structure 304 over the material layer 306). The non-lithosensitive structure includes openings that will be filled, at least partially, with lithosensitive material later on, i.e. photobucket openings. Again, various manners for providing such a non-lithosensitive structure with photobucket openings over a material to be etched are known in the art, such as e.g. forming self-aligned photobuckets, forming photobuckets by an etch-back process, and/or forming photobuckets by a lithographic/shrink/etch process, all of which are within the scope of the present disclosure.

Next, a layer of the first material 314 is provided on at least the side walls, but possibly also on the floors of the photobucket openings (box 604 in FIG. 6), which may be done in any of the manners described above.

Once the layer of the first material 314 has been provided, the remainder of the photobucket openings may be filed with the second material 316 (box 606 in FIG. 6).

In some embodiments, the second material 316 may comprise photoresist and may include for example, poly (methyl methacrylate), poly(methyl glutarimide), DNQ/novolac, or SU-8 (an expoxy based negative resist). The photoresist may be deposited by a casting process such as, for example, spin-coating. Spin coating may be performed at 1 to 10,000 rpm, including all values and ranges therein, for a time period in the range of 1 second to 10 seconds, including all values and ranges therein.

In some embodiments, the second material 316 may comprise an ultrafast photoresist or electron-beam resist or other lithosensitive material as formed in the openings of the photobuckets 302 lined with the first material 314. In one embodiment, the fast photoresist may be fabricated by removing a quencher from conventional, off-the-shelf, photoresist materials. In some embodiments, the second material 316 may be filled into the photobucket openings by spin coating, e.g. spin coating performed at to 10,000 rotations per minute (rpm), including all values and ranges therein, for a time period in the range of 1 second to 10 seconds, including all values and ranges therein. In some embodiment, spin coating may be followed by a thermal reflow of the second material 316.

The non-lithosensitive structure with filled photobucket openings may then be patterned by optically projecting an image of a desired pattern onto the structure or on the individual photobuckets using photolithography (box 608 in FIG. 6). In other words, in box 608, the non-lithosensitive structure with filled photobucket openings may be selectively exposed to light in order to irradiate certain selected photobuckets corresponding to the locations of the interconnects to be formed. Various types of photolithography may be used, such as e.g. optical photolithography, immersion photolithography, deep UV lithography, extreme UV lithography, or other techniques, where, in various embodiments, the wavelength of projected light may be up to 436 nm, including all values and ranges from 157 nm to 436 nm, such as 157 nm, 193 nm, 248 nm, etc. In an embodiment, EUV exposure may be an exposure in the range of 5-15 nm.

Following the exposure, the non-lithosensitive structure 304 with the selectively exposed photobuckets 302 is developed and portions of the second material 316 and possibly the first material 314 are removed to expose regions of the underlying material layer 306 correlating to the desired pattern (box 610 in FIG. 6). To that end, any of the known methods for developing exposed lithosensitive materials filling the exposed photobuckets may be used. For example, in an embodiment, a developer, such as e.g. TMAH (with or without surfactant) at a concentration of in the range of 0.1 N to 0.3 N, may be applied to the structure 304, e.g. by spin-coating, and portions of the second material 316 and possibly the first material 314 are then removed.

One or more additional steps as described above may also be performed to assist development and removal of the second and/or the first materials from the exposed photobuckets.

In some embodiments, baking of the material layer 306 may occur before or after any of the above steps. For example, the material layer 306 may be prebaked to remove surface water. In some embodiments, prebaking may be performed at a temperature in the range of 200° C. to 400° C., including all values and ranges therein, for a time of 30 to 60 minutes, including all values and ranges therein. After application of the first and/or the second materials within the photobuckets 302, a post application bake may occur, wherein at least a portion of the solvents in the photoresist are driven off. A post application bake may, for example, be performed at temperatures in the range of 70° C. to 140° C., including all values and ranges therein, for a time period in the range of 60 seconds to 240 seconds, including all values and ranges therein. After patterning, the lithosensitive materials within the photobuckets may be hard baked at a temperature in the range of 100° C. to 300° C., including all values and ranges therein, for a time period of 1 minute to 10 minutes, including all values and ranges therein.

As a result of the development and removal of at least the second material 316, but possibly also the first material 314 from the selected photobuckets, one or more selected interconnect location openings, e.g. via location openings, are formed in the structure 304. The term "interconnect location opening" is used to identify an opening in the structure 304 that exposes a portion of the underlying material layer 306, thereby defining a location of an interconnect to be formed.

Next, the exposed portions of the material layer 306 may be etched, e.g. chemically etched, through the interconnect location openings (box 612 in FIG. 6). During this process, the exposed portions of the surface of the material layer 306 are removed until a desired depth is achieved, forming openings in the material layer 306, openings referred to as "interconnect openings" within layer 306 which may be referred to as an "interconnect support layer."

At this point, the remaining photoresist may optionally be removed via a process such as ashing, wherein the photoresist is exposed to oxygen or fluorine, which combines with the photoresist to form ash.

The entire structure 304 may also be removed at this point, e.g. by chemical-mechanical polishing (CMP), wet-etch removal, or other common techniques. A final cleans step will generally be done to prepare the surface for metallization.

Next, the interconnect openings may be filled with one or more interconnect materials (box 614 in FIG. 6). Various parts of the interconnects openings may be filled with materials having a resistivity p of less than $4.0\mu\Omega\cdot cm$, such as in the range of $1.0\mu\Omega\cdot cm$ to $4.0\mu\Omega\cdot cm$. In various embodiments, different interconnect openings may be filled with same or different materials. Some exemplary materials may include one or more bulk materials comprising aluminum (Al), copper (Cu), tungsten (W), cobalt (Co), ruthenium (Ru), nickel (Ni), iron (Fe), and molybdenum (Mo) and/or one or more alloys comprising aluminum (Al), copper (Cu), tungsten (W), cobalt (Co), ruthenium (Ru), manganese (Mn), magnesium (Mg), boron (B), phosphorus (P), nitrogen (N), carbon (C), and sulfur (S).

In various embodiments, prior to filling the interconnect openings with interconnect fill materials, one or more of diffusion barrier and/or adhesions layers may be provided. Diffusion barrier layers refer to thin layers of materials that may prevent diffusion of the interconnect material from the interconnect opening into surrounding areas. Adhesion layers refer to thin layers of materials that may promote adhesion of different materials interfacing one another, e.g. an interconnect fill material and the surrounding material layer 306.

In some embodiments, deposition of the interconnect material may be performed using a conformal coating process, wherein the interconnect material is deposited on any exposed surfaces, including on the sidewalls, bottom, and throughout any interconnect opening formed in the interconnect support layer. The conformal coating process may be selected from processes such as chemical vapor deposition or atomic layer deposition. Other processes that may be used include physical vapor deposition such as, magnetron sputtering, evaporative deposition or e-beam deposition.

In chemical vapor deposition, for example, one or more reactive gases are provided in a chamber including the interconnect support layer at a flow rate of 5 sccm to 500 sccm, including all values and ranges therein. In some examples, the reactive gas may be selected from one or more of the following: pentakis(dimethylamino)tantalum, tris(diethylamido)(tert-butylimido)tantalum(V), tris(ethylmethylamido)(tert-butylimido)tantalum(V), or titanium tetrachloride and ammonia provided at a 1:1 stoichiometric ratio. The reactive gas may be provided with a carrier gas, such as an inert gas, which may include, for example, argon.

In some embodiments, the chamber may be maintained at a pressure in the range of 1 mTorr to 100 mTorr, including all values and ranges therein, and a temperature in the range of 100° C. to 500° C., including all values and ranges therein. In some embodiments, the process may be plasma assisted where electrodes are provided within the process chamber and are used to ionize the gases. Alternatively, plasma may be formed outside of the chamber and then supplied into the chamber. In the chamber, a layer of the metal is deposited due to reaction of the gas.

Physical vapor deposition processes for filling the interconnect materials may, again, include, for example, magnetron sputtering, evaporative deposition or e-beam deposition. An example of physical vapor deposition includes supplying an inert gas, such as argon, at a flow rate in the range of 5 sccm to 100 sccm, including all values and ranges therein, into a process chamber, which is held at a pressure in the range of $1\times10^{-1}$ torr to $10^{-7}$ torr, including all values and ranges therein. The process chamber may include a workpiece, i.e. the material layer 306 with the interconnect openings, and a metal source, called a target, formed of copper or aluminum. The metal source may be biased by a DC source rated in the range of 0.1 kW to 50 kW, including all values and ranges therein. The workpiece, or worktable upon which the workpiece is positioned, may also be biased by an AC source rated in the range of 0.1 kW to 1.5 kW, including all values and ranges therein. A plasma forms and is localized around the target due to magnets positioned proximal to or behind the target. The plasma bombards the target sputtering away the metal atoms as a vapor, which is then deposited on the workpiece. The process may continue for a time period in the range of 1 second to 100 seconds to allow growth of a layer of the interconnect material.

In some embodiments, first, a seed layer of the interconnect material (such as copper), in the range of 400 Angstroms to 600 Angstroms, such as 500 Angstroms, is formed by the physical vapor deposition process described above, followed by the electroplating of copper. During electroplating, the interconnect support layer 306 may be placed to a solution of copper sulfate and sulfuric acid. A current density in the range of 25 mA/cm$^2$ to 75 mA/cm$^2$, such as 50 mA/cm$^2$, may be applied for a time period of 30 seconds to 120 seconds, such as 60 seconds.

Referring again to FIG. 6, planarization may then be performed (box 616 of FIG. 6) to expose the top surfaces of the interconnect support layer 306. Planarization may be performed using either wet or dry planarization processes. In one embodiment, planarization is performed using chemical mechanical planarization (CMP), which may be understood as a process that utilizes a polishing surface, an abrasive and a slurry to remove the overburden and planarize the surface of the interconnect support layer 306 and the interconnect.

Figure 7:
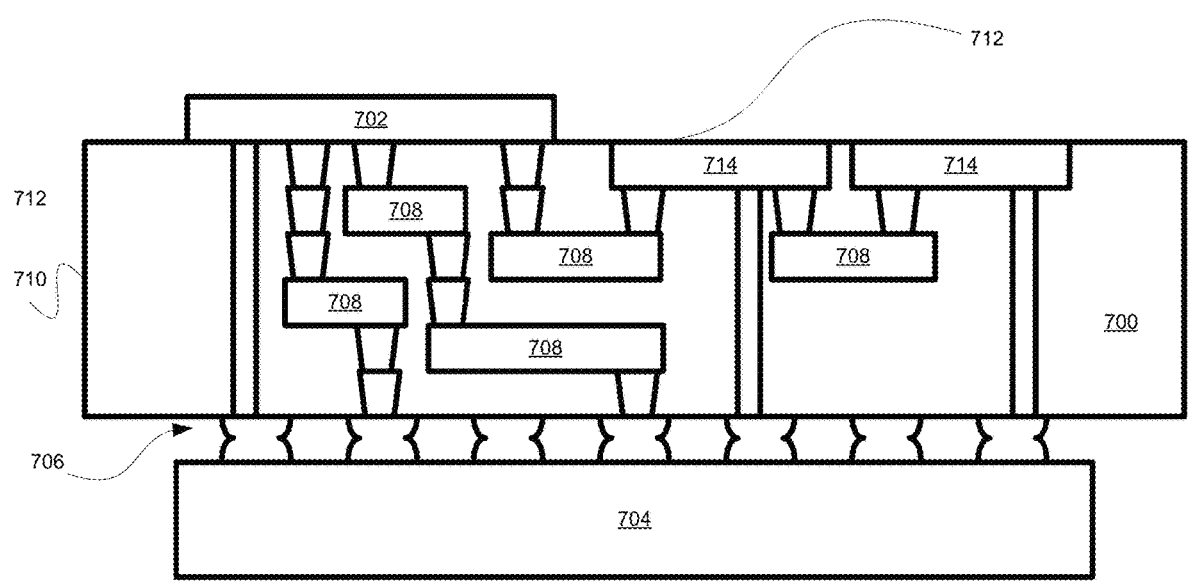
FIG. 7 provides a schematic illustration of an interposer, according to some embodiments of the present disclosure.

In accordance with embodiments of the disclosure, interconnects disclosed herein as well as other patterned features formed by using improved lithographic processing described herein may be used in the fabrication of an interposer, such as e.g. the one shown in FIG. 7.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/1004 may be attached to opposing sides of the interposer 700. In other embodiments, the first and second substrates 702/1004 may be attached to the same side of the interposer 700. In further embodiments, three or more substrates may be interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnect trenches 708 and vias 710, including but not limited to through-silicon vias (TSVs) 712. The vias 710 may be enclosed by first and second diffusion barrier layers as described herein. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700.

Figure 8:
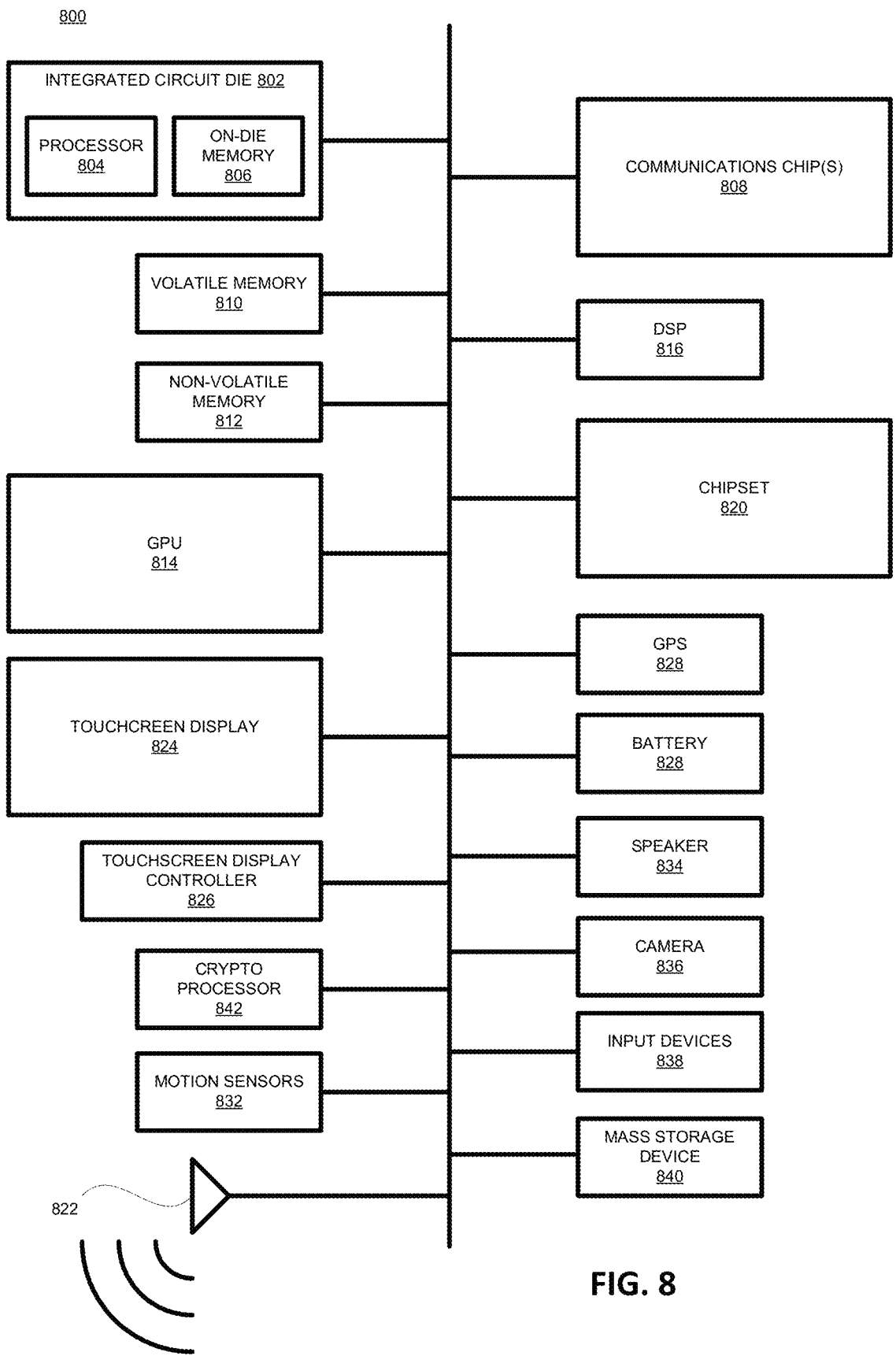
FIG. 8 provides a schematic illustration of a computing device built in accordance with some embodiments of the present disclosure.

FIG. 8 illustrates a computing device 800 in accordance with one embodiment of the disclosure. The computing device 800 may include a number of components. In one embodiment, these components may be attached to one or more motherboards. In an alternate embodiment, some or all of these components may be fabricated onto a single system-on-a-chip (SoC) die. The components in the computing device 800 include, but are not limited to, an integrated circuit die 802 and at least one communications logic unit 808. In some implementations the communications logic unit 808 may be fabricated within the integrated circuit die 802 while in other implementations the communications logic unit 808 may be fabricated in a separate integrated circuit chip that may be bonded to a substrate or motherboard that may be shared with or electronically coupled to the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STT-MRAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 828 or other power source, a power amplifier (not shown), a voltage regulator (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WIMAX (IEEE 802.16 family), IEEE 802.20, long term evolution (LIE), Ev-DO, HSP+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 may include one or more interconnects or other lithographically patterned features that are formed in accordance with embodiments of the present disclosure. The term "processor" may refer to any device or portion of a device that processes electronic data from registers and/or memory to transform that electronic data into other electronic data that may be stored in registers and/or memory.

The communications logic unit 808 may also include one or more interconnects or other lithographically patterned features that are formed in accordance with embodiments of the present disclosure.

In further embodiments, another component housed within the computing device 800 may contain one or more interconnects or other lithographically patterned features that are formed in accordance with embodiments of the present disclosure.

In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some Examples in accordance with various embodiments of the present disclosure are now described.

Example 1 provides a method of at least preparing photobuckets for lithography. The method includes providing a plurality of photobuckets on a material to be etched; providing a layer of a first lithosensitive material on side walls and floors of the plurality of photobuckets; and filling the plurality of photobuckets layered with the first lithosensitive material with a second lithosensitive material, wherein the second lithosensitive material is more lithosensitive than the first lithosensitive material.

Providing a plurality of photobuckers refers to providing a non-lithosensitive structure on the material to be etched, the structure comprising a top surface and a bottom surface, the bottom surface being the closest to the material to be etched, the structure further comprising a plurality of openings extending from the top surface to the bottom surface. The photobuckets are the openings in such a structure.

As previously described herein, the term "lithosensitive" is used to describe materials that, upon their exposure to a lithographic beam, such as e.g., optical irradiation during photolithography or e.g. an electron beam during electron-beam lithography, followed by chemical processing, may be removed, thereby allowing patterning. Material A is said to be "more lithosensitive" than material B if exposure of both materials to the same or comparable lithographic beams, more of the material A can be removed than of the material B. As used herein, an expression stating that one material is more lithosensitive than another also covers scenarios where the latter material is not lithosensitive at all (i.e. exposing such a material to a lithographic beam does not result in any of the material becoming removable).

Example 2 provides a method according to Example 1, where providing the layer of the first lithosensitive material includes grafting the first lithosensitive material to the side wall and the floors of the plurality of photobuckets.

Example 3 provides a method according to Examples 1 or 2, where providing the layer of the first lithosensitive material includes applying a surface treatment that attaches the first lithosensitive material to the side walk and the floors of the plurality of photobuckets.

Example 4 provides a method according to Example 3, where the surface treatment includes a vapor phase treatment.

Example 5 provides a method according to Example 3, where the surface treatment includes a solution phase treatment.

Example 6 provides a method as in any one of the preceding Examples, where the first lithosensitive material includes quenchers.

As used herein, the term "quencher" refers to a material having basicity greater than acid generated from a photoacid generator, where the term "photoacid generator" refers to a molecule or a material that generates acid after absorption of one or more photons. As used herein, the term "quencher molecule" refers to a molecule having basicity greater than acid generated from a photoacid generator.

Example 7 provides a method as in Example 6, where the quencher molecules include amines or/and pyridines.

Example 8 provides a method as in Example 6, where the quencher molecules include pyridylethyltriethoxysilane (PETES) or/and aminopropyitriethoxysilane (APTES).

Example 9 provides a method as in Example 6, where the quencher molecules include compounds based on or/and including triarylsulfonium, diaryliodonium, tetraarylphosphonium and other photoactive salts with weak conjugate acid anions.

As used herein, the term "weak conjugate acid anions" is used to describe anionic component of a photodecomposable base or quencher where $pK_a$ of the resulting acid is greater than 3. As is well-known, $pK_a$ is a measure of strength of acids, with the smaller value of $pK_a$, the stronger the acid. Parameter $pK_a$ refers to the logarithmic constant of the acid dissociation constant, $K_a$.

Example 10 provides a method as in Example 9, where conjugate acid anions include benzoates, carboxylates, hydroxide, alkoxide, thiolate and other weak conjugate acids.

Example 11 provides a method as in Examples 9 or 10, where providing the layer of the first lithosensitive material on the side walls and the floors of the plurality of photobuckets includes grafting the quencher molecules to the side walls and the floors of the plurality of photobuckets by attaching one or more of sulfonium aryl groups of the quencher molecules to grafting groups of the side walls and the floors of the plurality of photobuckets.

As used herein, the term "grafting group" is used to describe a functional group which reacts with and covalently bonds to functionality on a surface, in this case on the surface of the photobuckets.

Example 12 provides a method as in Example 11, where the grafting groups include —Si(OEt)3 groups.

Example 13 provides a method as in any one of Examples 6-12, where a thickness of the layer of the first lithosensitive material depends on one or more of a type of the quencher molecules, a concentration of the quencher molecules, and processing conditions used to apply the quencher molecules to provide the layer of the first lithosensitive material.

Example 14 provides a method as in any one of Examples 6-13, where a concentration of the quencher molecules in the layer of the first lithosensitive material is greater than a concentration of the quencher molecules in the second lithosensitive material.

Example 15 provides a method as in any one Examples 6-14, where the quencher molecules include photo-released quencher molecules.

Example 16 provides a method as in any one of the preceding Examples, where one or more side walls and floors of the plurality of photobuckets include a material that absorbs more photons than the first lithosensitive material and than the second lithosensitive material and/or possesses a greater affinity for ejecting electrons than the first lithosensitive material and than the second lithosensitive material.

Example 17 provides a method as in any one of the preceding Examples, where one or more side walls and floors of the plurality of photobuckets include a thin film of one or more of silicon oxide, metals, metal oxides and metal nitrides.

Example 18 provides a method as in any one of the preceding Examples, further including exposing and developing the first and the second lithosensitive materials in one or more of the plurality of photobuckets.

Example 19 provides a method as in Example 18, further including applying a dilute acid to detach the layer of the first lithosensitive material in the exposed one or more of the plurality of photobuckets.

Example 20 provides a method as in Examples 18 or 19, where exposing includes exposing the first and the second lithosensitive materials in the one or more of the plurality of photobuckets to extreme ultra-violet irradiation or a charged-particle beam.

Example 21 provides a method as in any one of Examples 18-20, further including removing the first and the second lithosensitive materials from the developed one or more of the plurality of photobuckets to form one or more via location openings.

Example 22 provides a method as in Example 21, further including etching the material through the one or more via location openings to form corresponding via openings in the material.

Example 23 provides a method as in Example 22, further including filling the via openings with conductive material to form conductive vias.

Example 24 provides a method as in Example 23, further including forming conductive lines above the conductive vias.

Example 25 provides a method for forming interconnects, the method including providing a non-lithosensitive structure over a dielectric layer, the structure including a top surface and a bottom surface, the bottom surface being closest to the dielectric layer, and further including a plurality of openings extending from the top surface to the bottom surface; providing a layer of a first material at least on side walls of the plurality of openings; filling the plurality of openings layered with the first material with a second material, where the first material is not lithosensitive while the second material is lithosensitive or the first material includes a first lithosensitive material, the second material includes a second lithosensitive material and the second photosensitive material is more lithosensitive than the first lithosensitive material; selectively exposing the non-lithosensitive structure with the plurality of openings filled with the second material to extreme ultra-violet irradiation or a charged-particle beam; developing the exposed non-lithosensitive structure; removing at least the second material in one or more of the plurality of openings of the developed non-lithosensitive structure to form one or more interconnect location openings; etching the dielectric layer through the one or more interconnect location openings to form one or more interconnect openings; and filling the one or more interconnect openings with an electrically conductive material to form one or more interconnects.

Example 26 provides a method as in Example 25, where the plurality of opening extend from the top surface to the bottom surface in a direction substantially perpendicular to the dielectric layer.

Example 27 provides a method as in Example 25, where providing the layer of the first material includes applying a surface treatment that attaches the first to at least the side walls of the plurality of openings.

Example 28 provides a method as in Example 27, where attaching the first material to the side walls of the plurality of openings includes grafting the first material to the side walls of the plurality of openings.

Example 29 provides a method as in Examples 27 or 28, where the surface treatment includes a vapor phase treatment or/and a solution phase treatment.

Example 30 provides a method as in any one of Examples 25-29, where the first material includes quencher molecules.

Example 31 provides a method as in Example 30, where the quencher molecules include amines or/and pyridines.

Example 32 provides a method as in Example 30, where the quencher molecules include pyridylethyltriethoxysilane (PETES) or/and aminopropyltriethoxysilane (APTES).

Example 33 provides a method as in Example 30, where the quencher molecules include compounds based on triarylsulfonium, diaryliodonium, tetraarylphosphonium and other photoactive salts with weak conjugate acid anions.

Example 34 provides a method as in Example 33, where conjugate acid anions include benzoates, carboxylates, hydroxide, alkoxide, thiolate and other weak conjugate acids.

Example 35 provides a method as in Examples 33 or 34, where providing the layer of the first material on the side walls of the plurality of openings includes grafting the quencher molecules to the side walls by attaching one or more of sulfonium aryl groups of the quencher molecules to grafting groups of the side walls.

Example 36 provides a method as in Example 35, where the grafting groups include —Si(OEt)3 groups.

Example 37 provides a method as in any one of Examples 30-36, where a thickness of the layer of the first material depends on one or more of a type of the quencher molecules, a concentration of the quencher molecules, and processing conditions used to apply the quencher molecules to provide the layer of the first material.

Example 38 provides a method as in any one of Examples 30-37, where a concentration of the quencher molecules in the layer of the first material is greater than a concentration of the quencher molecules in the second material.

Example 39 provides a method as in any one Examples 30-38, where the quencher molecules include photo-released quencher molecules.

Example 40 provides a method as in any one of Examples 25-39, where one or more side walls of the plurality of openings include a material that absorbs more photons than the first material and than the second material and/or possesses a greater affinity for ejecting electrons than the first material and than the second material.

Example 41 provides a method as in any one of Examples 25-40, where one or more side walls of the plurality of openings include a thin film of one or more of silicon oxide, metals, metal oxides and metal nitrides.

Example 42 provides a method as in any one of Examples 25-41, further including applying a dilute acid to detach the layer of the first material in the exposed one or more of the plurality of openings.

Example 43 provides a method of at least preparing photobuckets for lithography, the method including providing a plurality of photobuckets on a material to be etched; providing a layer of a first materials at least on side walls of the plurality of photobuckets; and filling the plurality of photobuckets layered with the first material with a second material, where the first material is not lithosensitive while the second material is lithosensitive, or the first material includes a first lithosensitive material, the second material includes a second lithosensitive material, and the second photosensitive material is more lithosensitive than the first lithosensitive material.

Example 44 provides a method as in Example 43, where the material to be etched includes a dielectric layer.

Example 45 provides a method as in Examples 43 or 44, where the plurality of photobuckets are a plurality of openings in an non-lithosensitive structure disposed over the material to be etched.

Example 46 provides a method as in Example 45, where the non-lithosensitive structure includes a top surface and a bottom surface, the bottom surface being closest to the material to be etched, and where the plurality of openings extend from the top surface to the bottom surface of the non-lithosensitive structure in a direction substantially perpendicular to the material to be etched.

Example 47 provides a method as in any one of Examples 43-46, where providing the layer of the first material includes applying a surface treatment that attaches the first to at least the side walls of the plurality of photobuckets.

Example 48 provides a method as in Example 47, where the surface treatment includes a vapor phase treatment or/and a solution phase treatment.

Example 49 provides a method as in any one of Examples 43-48, where providing the layer of the first material includes grafting the first material to the side walls of the plurality of photobuckets.

Example 50 provides a method as in any one of Examples 43-49, where the first material includes quencher molecules.

Example 51 provides a method as in Example 50, where the quencher molecules include amines or/and pyridines.

Example 52 provides a method as in Example 50, where the quencher molecules include pyridylethyltriethoxysilane (PETES) or/and aminopropyltriethoxysilane (APTES).

Example 53 provides a method as in Example 50, where the quencher molecules include compounds based on triarylsulfonium, diaryliodonium, tetraarylphosphonium and other photoactive salts with weak conjugate acid anions.

Example 54 provides a method as in Example 53, where conjugate acid anions include benzoates, carboxylates, hydroxide, alkoxide, thiolate and other weak conjugate acids.

Example 55 provides a method as in Examples 53 or 54, where providing the layer of the first material on the side walls of the plurality of photobuckets includes grafting the quencher molecules to the side walls by attaching one or more of sulfonium aryl groups of the quencher molecules to grafting groups of the side walls.

Example 56 provides a method as in Example 55, where the grafting groups include —Si(OEt)3 groups.

Example 57 provides a method as in any one of Examples 50-56, where a thickness of the layer of the first material depends on one or more of a type of the quencher molecules, a concentration of the quencher molecules, and processing conditions used to apply the quencher molecules to provide the layer of the first material.

Example 58 provides a method as in any one of Examples 50-57, where a concentration of the quencher molecules in the layer of the first material is greater than a concentration of the quencher molecules in the second material.

Example 59 provides a method as in any one Examples 50-58, where the quencher molecules include photo-released quencher molecules.

Example 60 provides a method as in any one of Examples 43-59, where one or more side walls of the plurality of photobuckets include a material that absorbs more photons than the first material and than the second material and/or possesses a greater affinity for ejecting electrons than the first material and than the second material.

Example 61 provides a method as in any one of Examples 43-60, where one or more side walls of the plurality of photobuckets include a thin film of one or more of silicon oxide, metals, metal oxides and metal nitrides.

Example 62 provides a method as in any one of Examples 43-61, further including exposing and developing the first and the second materials in one or more of the plurality of photobuckets.

Example 63 provides a method as in Example 62, further including applying a dilute acid to detach the layer of the first material in the exposed one or more of the plurality of photobuckets.

Example 64 provides a method as in Examples 62 or 63, where exposing includes exposing the first and the second materials in the one or more of the plurality of photobuckets to extreme ultra-violet irradiation or a charged-particle beam.

Example 65 provides a method as in any one of Examples 62-64, further including removing the first and the second materials from the developed one or more of the plurality of photobuckets to form one or more via location openings.

Example 66 provides a method as in Example 65, further including etching the material through the one or more via location openings to form corresponding via locations in the material.

Example 67 provides a method as in Example 66, further including filling the via locations with conductive material to form conductive vias.

Example 68 provides a method as in Example 67, further including forming conductive lines above the conductive vias.

Example 69 provides an assembly for forming nanostructures, e.g. nanostructures for use in IC fabrication. The assembly includes a material to be etched and a non-lithosensitive structure provided thereon. The material to be etched could be e.g. a layer of a dielectric material, e.g. an ILD for forming interconnects. The non-lithosensitive structure provided over the material to be etched includes a plurality of openings (photobuckets) extending in a direction that is substantially perpendicular to the top surface (i.e. the surface to be etched) of the material to be etched. The plurality of openings have a layer of a first material and a layer of a second material provided at least on side walls, but possibly also on the bottom or the floor of the plurality of openings. The layer of the first material is provided closer to the side walls of the plurality of openings than the layer of the second material. The second material is more lithosensitive than the first material.

Example 70 provides the assembly according to Example 69, where the first material includes quencher molecules.

Example 71 provides the assembly according to Example 70, where the quencher molecules include amines or/and pyridines.

Example 72 provides the assembly according to Example 70, where the quencher molecules include pyridylethyltriethoxysilane (PETES) or/and aminopropyltriethoxysilane (APTES).

Example 73 provides the assembly according to Example 70, where the quencher molecules include compounds based on triarylsulfonium, diaryliodonium, tetraarylphosphonium and other photoactive salts with weak conjugate acid anions.

Example 74 provides the assembly according to Example 73, where conjugate acid anions include benzoates, carboxylates, hydroxide, alkoxide, thiolate and other weak conjugate acids.

Example 75 provides the assembly according to Examples 73 or 74, where the layer of the first material includes the quencher molecules grafted to the side walls by attaching one or more of suftonium aryl groups of the quencher molecules to grafting groups of the side walls.

Example 76 provides the assembly according to Example 75, where the grafting groups include —Si(OEt)3 groups.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. A method of at least preparing photobuckets for lithography, the method comprising:
providing a plurality of photobuckets on a material to be etched;
providing a layer of a first lithosensitive material on side walls and floors of the plurality of photobuckets; and filling the plurality of photobuckets layered with the first lithosensitive material with a second lithosensitive material, wherein the second lithosensitive material is more lithosensitive than the first lithosensitive material.

2. The method according to claim 1, wherein providing the layer of the first lithosensitive material comprises grafting the first lithosensitive material to the side walls and the floors of the plurality of photobuckets.

3. The method according to claim 1, wherein providing the layer of the first lithosensitive material comprises applying a surface treatment that attaches the first lithosensitive material to the side walls and the floors of the plurality of photobuckets.

4. The method according to claim 1, wherein the first lithosensitive material comprises quencher molecules.

5. The method according to claim 4, wherein the quencher molecules comprise amines or/and pyridines.

6. The method according to claim 4, wherein the quencher molecules comprise pyridylethyltriethoxysilane (PETES) or/and aminopropyltriethoxysilane (APTES).

7. The method according to claim 4, wherein the quencher molecules comprise compounds based on triarylsulfonium, diaryliodonium, tetraarylphosphonium and other photoactive salts with weak conjugate acid anions.

8. The method according to claim 7, wherein the quencher molecules comprise compounds based on photoactive salts with weak conjugate acid anions, and the conjugate acid anions comprise benzoates, carboxylates, hydroxide, alkoxide, thiolate and other weak conjugate acids.

9. The method according to claim 7, wherein providing the layer of the first lithosensitive material on the side walls and the floors of the plurality of photobuckets comprises grafting the quencher molecules to the side walls and the floors of the plurality of photobuckets by attaching one or more of sulfonium aryl groups of the quencher molecules to grafting groups of the side walls and the floors of the plurality of photobuckets.

10. The method according to claim 4, wherein a concentration of the quencher molecules in the layer of the first lithosensitive material is greater than a concentration of the quencher molecules in the second lithosensitive material.

11. The method according to claim 4, wherein the quencher molecules comprise photo-released quencher molecules.

12. The method according to claim 1, wherein one or more side walls and floors of the plurality of photobuckets comprise a material that absorbs more photons than the first lithosensitive material and than the second lithosensitive material and/or possesses a greater affinity for ejecting electrons than the first lithosensitive material and than the second lithosensitive material.

13. The method according to claim 1, wherein one or more side walls and floors of the plurality of photobuckets comprise a layer of one or more of silicon oxide, metals, metal oxides and metal nitrides.

14. A method for forming interconnects, the method comprising:
providing a non-lithosensitive structure over a dielectric layer, the structure comprising a top surface and a bottom surface, the bottom surface being closest to the dielectric layer, and further comprising a plurality of openings extending from the top surface to the bottom surface;
providing a layer of a first material at least on side walls of the plurality of openings;
filling the plurality of openings layered with the first material with a second material, wherein
the first material comprises a first lithosensitive material, the second material comprises a second lithosensitive material, and the second lithosentive material is more lithosensitive than the first lithosensitive material;
selectively exposing the non-lithosensitive structure with the plurality of openings filled with the second material to extreme ultra-violet irradiation or a charged-particle beam;
developing the exposed non-lithosensitive structure;
removing at least the second material in one or more of the plurality of openings of the developed non-lithosensitive structure to form one or more interconnect location openings;
etching the dielectric layer through the one or more interconnect location openings to form one or more interconnect openings; and
filling the one or more interconnect openings with an electrically conductive material to form one or more interconnects.

15. The method according to claim 14, wherein the plurality of opening extend from the top surface to the bottom surface in a direction substantially perpendicular to the dielectric layer.

16. The method according to claim 14, wherein providing the layer of the first material comprises applying a surface treatment that attaches the first material to at least the side walls of the plurality of openings.

17. The method according to claim 16, wherein the surface treatment comprises a vapor phase treatment or/and a solution phase treatment.

18. The method according to claim 14, wherein one or more side walls of the plurality of openings comprise a thin film of one or more of silicon oxide, metals, metal oxides and metal nitrides.

19. The method according to claim 14, further comprising applying a dilute acid to detach the layer of the first material in the exposed one or more of the plurality of openings.

20. The method according to claim 14, wherein the first lithosensitive material comprises amines or/and pyridines.

21. A method of at least preparing photobuckets for lithography, the method comprising:
providing a plurality of photobuckets on a material to be etched;
providing a layer of a first material on side walls of the plurality of photobuckets; and
filling the plurality of photobuckets layered with the first material with a second material, wherein the first material comprises molecules grafted to the side walls by having one or more of sulfonium aryl groups of the molecules attached to grafting groups of the side walls.

22. The method according to claim 21, wherein the first material comprises a first lithosensitive material, the second material comprises a second lithosensitive material, and the second photosentive material is more lithosensitive than the first lithosensitive material.

23. The method according to claim 21, wherein the plurality of photobuckets are a plurality of openings in a non-lithosensitive structure disposed over the material to be etched.

24. An assembly for forming nanostructures, the assembly comprising:
a material to be etched; and
a non-lithosensitive structure provided over the material to be etched, the structure comprising a plurality of openings extending in a direction that is substantially perpendicular to the material to be etched, the plurality of openings having a layer of a first material and a layer of a second material provided at least on side walls of the plurality of openings, the layer of the first material being provided closer to the side walls of the plurality of openings than the layer of the second material, wherein the second material is more lithosensitive than the first material and the first material comprises amines or/and pyridines.

25. The assembly according to claim 24, wherein the layer of the first material comprises quencher molecules grafted to the side walls by having one or more of sulfonium aryl groups of the quencher molecules attached to grafting groups of the side walls.

\* \* \* \* \*

UNITED STATES PATENT AND TRADEMARK OFFICE
CERTIFICATE OF CORRECTION

PATENT NO. : 10,490,416 B2
APPLICATION NO. : 15/769017
DATED : November 26, 2019
INVENTOR(S) : Robert L. Bristol et al.

Page 1 of 1

It is certified that error appears in the above-identified patent and that said Letters Patent is hereby corrected as shown below:

In the Drawings

On sheet 9 of 9, in FIG. 8, Reference Numeral 824, Line 1, delete "TOUCHCREEN" and insert -- TOUCHSCREEN --, therefor.

In the Claims

In Column 24, Line 3, in Claim 14, delete "lithosentive" and insert -- lithosensitive --, therefor.

In Column 24, Line 55, in Claim 21, delete "photosentive" and insert -- photosensitive --, therefor.

Signed and Sealed this
Eighteenth Day of February, 2020

Andrei Iancu
*Director of the United States Patent and Trademark Office*